(12) United States Patent
Husted et al.

(10) Patent No.: US 7,245,893 B1
(45) Date of Patent: Jul. 17, 2007

(54) METHOD AND SYSTEM FOR NOISE FLOOR CALIBRATION AND RECEIVE SIGNAL STRENGTH DETECTION

(75) Inventors: Paul J. Husted, Palo Alto, CA (US); William J. McFarland, Los Altos, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 660 days.

(21) Appl. No.: 10/254,151

(22) Filed: Sep. 25, 2002

Related U.S. Application Data

(60) Provisional application No. 60/325,024, filed on Sep. 25, 2001.

(51) Int. Cl.
*H04B 17/00* (2006.01)

(52) U.S. Cl. ............................. 455/226.5; 455/226.2; 455/234.1; 375/345

(58) Field of Classification Search ............. 455/232.1, 455/234.1, 234.2, 226.1, 226.2, 226.3; 375/345; 343/703
See application file for complete search history.

(56) References Cited

U.S. PATENT DOCUMENTS

| | | | | |
|---|---|---|---|---|
| 4,888,596 A | * | 12/1989 | Conanan | 343/703 |
| 5,204,970 A | * | 4/1993 | Stengel et al. | 455/69 |
| 5,884,152 A | * | 3/1999 | Matsumoto | 455/234.1 |
| 6,731,703 B2 | * | 5/2004 | Kurihara | 375/345 |
| 6,977,915 B2 | * | 12/2005 | Chen et al. | 370/335 |
| 2003/0022645 A1 | * | 1/2003 | Runzo | 455/226.2 |

* cited by examiner

*Primary Examiner*—Edward F. Urban
*Assistant Examiner*—Blane J. Jackson
(74) *Attorney, Agent, or Firm*—Bever, Hoffman & Harms, LLP; Jeanette S. Harms

(57) ABSTRACT

A system for detecting the level of the noise floor due to circuit noise as seen at the ADC for a wireless receiver. The system measures power after digitizing and filtering, and subtracts off any variable gain used in the analog front end to determine differentially the size of the signal at the antenna. The system further differentially detects the signal size of any incoming signal at the antenna in a similar fashion, and determines its size relative to the measured noise floor. If the level of the circuit noise of the receiver is known absolutely, the absolute signal size of the incoming signal can likewise be determined with this inventive method and system.

55 Claims, 9 Drawing Sheets

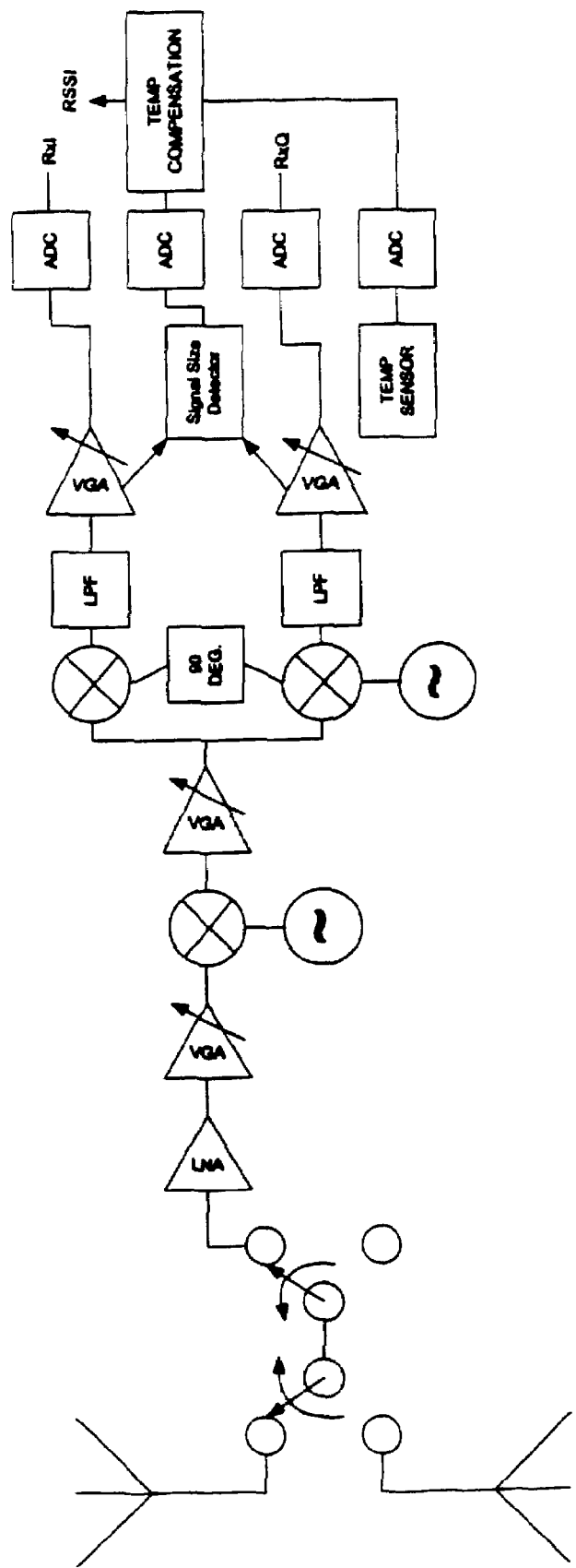
FIG. 9 - PRIOR ART

METHOD AND SYSTEM FOR NOISE FLOOR CALIBRATION AND RECEIVE SIGNAL STRENGTH DETECTION

CLAIM OF PRIORITY

This invention claims priority to the following co-pending U.S. provisional patent application, which is incorporated herein by reference, in its entirety:

Husted et al, Provisional Application Ser. No. 60/325,024, entitled "METHOD AND SYSTEM FOR NOISE FLOOR CALIBRATION AND RECEIVE SIGNAL STRENGTH DETECTION," filed, Sep. 25, 2001.

BACKGROUND OF THE INVENTION

1. Field of the Invention

The present invention is directed to communication systems. More particularly, the invention is directed to receivers in wireless communication systems. Even more particularly, the present invention is directed to noise floor calibration and signal strength detection systems for such wireless communication system receivers.

2. Background

The use of receivers in wireless systems such as radio and cellular communication systems is well-known in the art. FIG. 1 shows a typical superheterodyne receiver design 10. Here, a radio frequency (RF) signal is received on antenna 15 and provided to RF amplifier 20. The RF signal is amplified by the RF amplifier 20 and in mixer 25 mixed with a signal from a local oscillator 30. This produces an intermediate frequency (IF) signal that is amplified in an IF amplifier 35 and filtered in a bandpass filter 40. The filtered IF signal is again amplified by an IF amplifier 45 and mixed in a product detector 50 with a signal from a beat frequency oscillator 55. The result is a signal that is amplified by a baseband amplifier 60 and digitized for further processing by an analog-to-digital (A/D) converter 65.

The physical layers of most radio systems are able to return a Received Signal Strength Indication (RSSI). This RSSI value is normally expressed in absolute signal power. However, for many purposes a relative signal strength between two measurements can serve as well.

The RSSI value is commonly used for the following purposes:

Clear Channel Assessment: Many protocols employ a Carrier Sense Multiple Access (CSMA) method for sharing the channel. This type of listen-before-talk protocol typically will have a threshold, expressed in absolute signal strength (dBm), at which the channel should be considered busy and transmissions should be held off. For example, the 802.11a wireless LAN protocol states that the receiver must detect any in-band signal above −62 dBm and declare the medium busy for the duration of this signal.

Feedback to the user: An indication of the signal to noise ratio (SNR) of the received packet can be given to the user. This indication can be a relative measurement comparing the observed signal strength of the packet with the observed signal strength of the noise. The user can also be shown the absolute signal size of received packets. Both measurements can be used together to distinguish between poor reception due to a weak signal, and poor reception due to excessive noise.

Channel selection: The Media Access Controller (MAC) can use the received SNR sampled on several different channels to select the best frequency channel and access point to associate with. In this case the radio would be looking for both the amount of noise in a given channel as well as the strength and prevalence of interfering signals.

Roaming/Hand-off: Similar to channel selection, a station that is already associated with one access point (AP) can look for other APs that provide stronger signals. In this case, relative RSSI measurements can serve the requirements adequately. However, an absolute RSSI value may be more convenient, as a station may not want to even begin to search for another AP until the signals from its current AP fall below a certain level.

As this list indicates, both relative and absolute measurements of the received signals and the noise floor are useful in a radio system.

Discussion of the Available Art

A number of methods have been used to provide accurate receive signal strength indications; most of these are based on building circuits that themselves provide very high accuracy. However, each of the available approaches requires complicated designs, or the use of semiconductor technology with a high degree of accuracy and repeatability, leading to high costs.

The traditional method for accurately finding RSSI is illustrated in FIG. 9. In this case, the signal is received through the entire receive chain. Significant amounts of gain are added along the path so that the desired signal is large when its size is measured. The size at the antenna is then predicted by subtracting the receive gain from the measured size of the signal in the baseband.

An advantage to this approach is that the received signal can be put through a narrow baseband filter, which removes any unwanted out of channel signals so that the power measurement can be based on only the desired signal.

However, there are a number of disadvantages to this approach. Traditional analog signal strength measurement circuits are tricky to design and require a high degree of analog accuracy and repeatability. While it is reasonable to achieve accuracy in bipolar integrated circuits, it is much more difficult in inexpensive CMOS technology. These inexpensive CMOS process fabrication technologies were designed for digital circuits, and do not commonly provide the accuracy or manufacture quality control and repeatability that makes design of accurate circuits convenient.

Even using bipolar technology, most signal strength indicators built into the analog domain need to be temperature compensated. This can be done with additional analog circuitry or by measuring the temperature and correcting the RSSI value digitally. In addition, a separate analog to digital converter (ADC) is required to digitize the RSSI signal, and possibly the temperature detector as well in order to temperature compensate the RSSI signal.

Along with the difficulty of making an accurate signal power measurement at baseband, there are difficulties in referring the measurement to the antenna. In order to estimate how big the signal was at the antenna, the gain between where signal strength is measured and the antenna must be known. This gain changes over temperature and process variations, especially in an inexpensive CMOS technology. In addition, variation in the components used to match the RF circuits can cause significant variation in gain from one unit to another.

Some of the variation in gain can be avoided by placing the signal magnitude detection circuit closer to the antenna. However, because the received signal can be very small, such a circuit is difficult to construct accurately. In addition, since it is measured at a point before the narrow channel filter, the measured signal size will depend not only on the desired signal, but will also include any undesired signals in nearby channels. This limited filtering effect can be a problem even with baseband signal detection in modern receivers, as much of the receive signal filtering is done in the digital baseband, after analog RSSI detection.

SUMMARY OF THE INVENTION

The present invention provides a relative estimate of the power of the thermal noise floor of the receiver, equal to the thermal noise at the antenna plus the noise figure of the receiver's analog front end. The receive signal strength of incoming signals can then be determined relative to the measured noise floor, returning the signal to noise ratio (SNR) of the signal. Further, for certain implementations with a given receiver at a given temperature, the gains of the system will not vary and the noise floor level is deterministic, so the absolute signal size of an incoming signal can be computed directly from the relative computed RSSI value.

BRIEF DESCRIPTION OF THE DRAWINGS

These and other aspects of an embodiment of the present invention are better understood by reading the following detailed description of the preferred embodiment, taken in conjunction with the accompanying drawings, in which:

FIG. 9 is a block diagram of an available receiver utilizing an available circuit and technique for obtaining RSSI.

DETAILED DESCRIPTION

Figure 1:
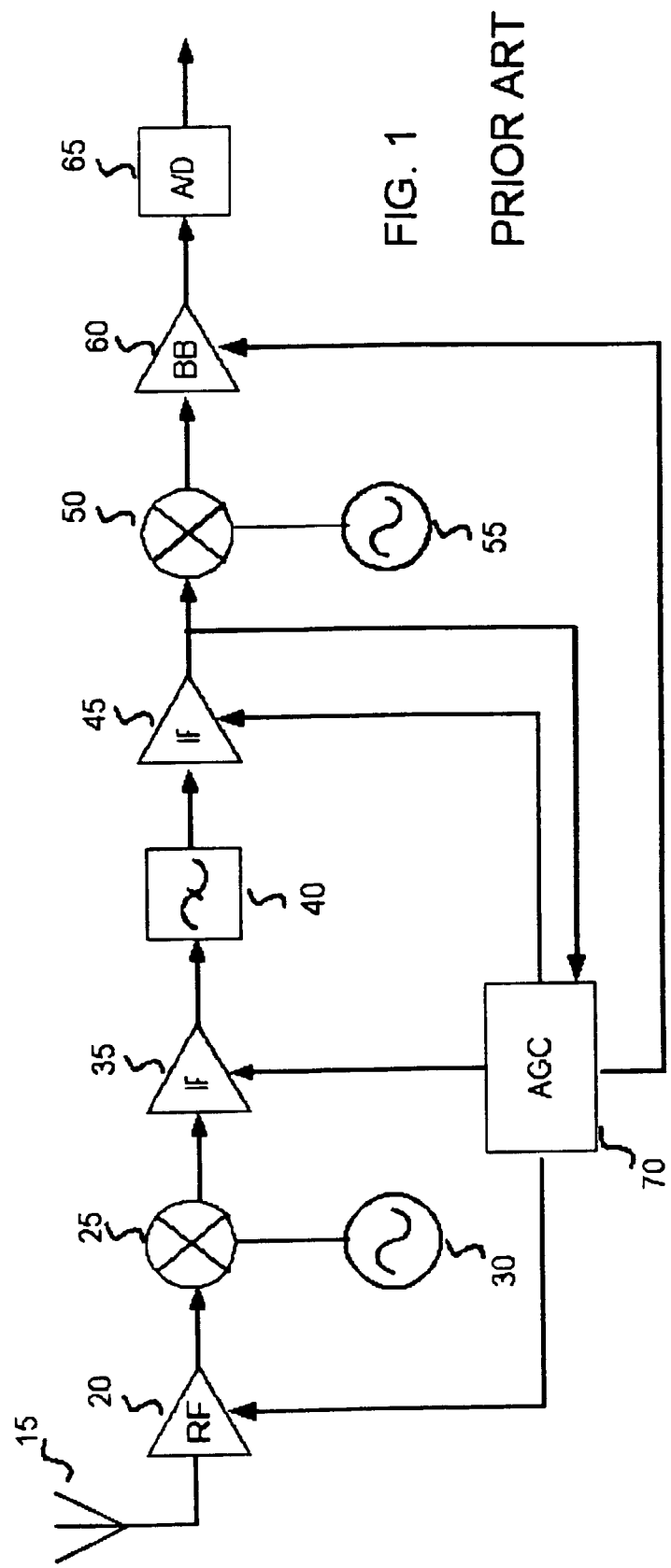
FIG. 1 shows the structure of a communications receiver according to the prior art.
Figure 2:
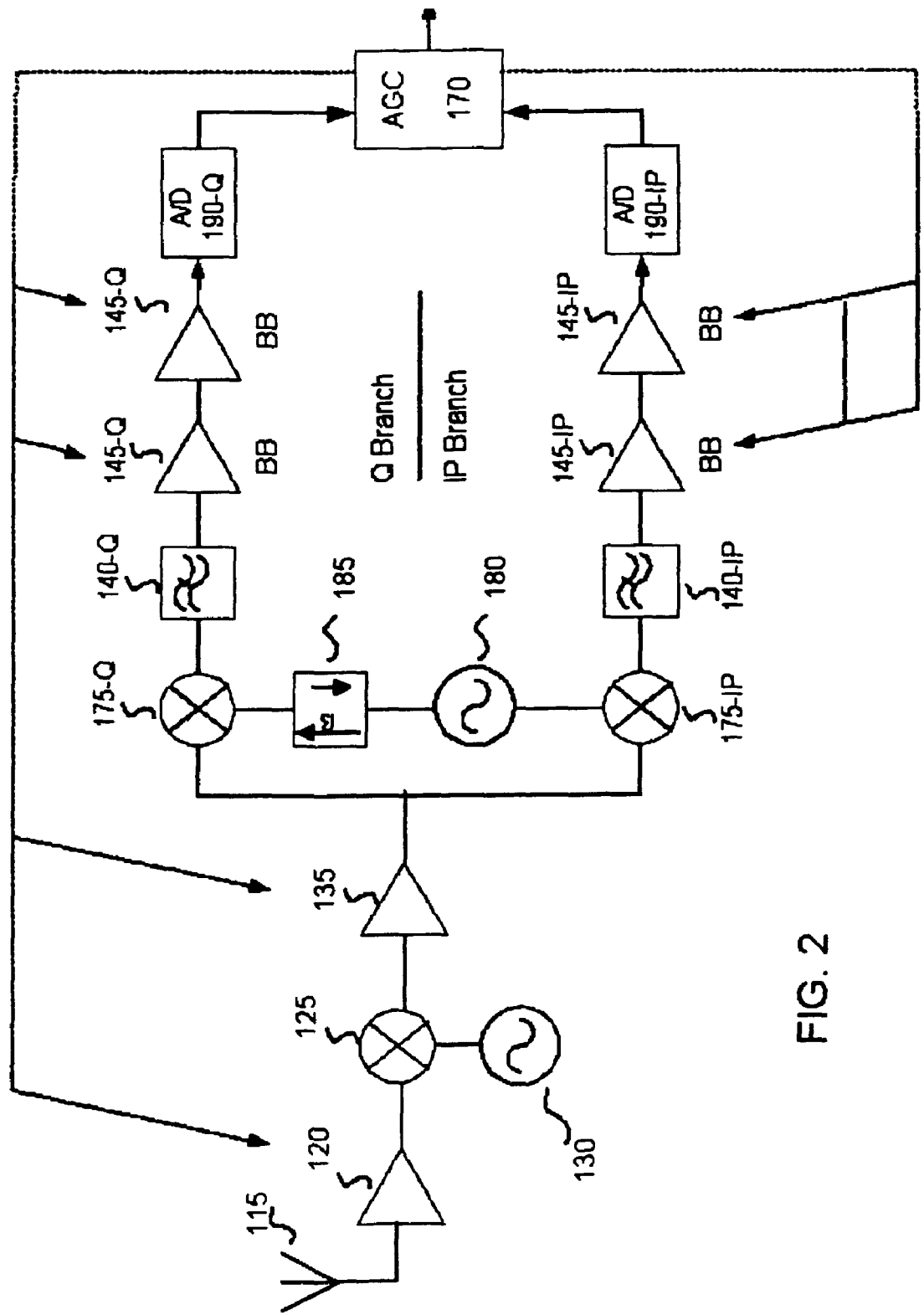
FIG. 2 shows the structure of a communications receiver according to an embodiment of the present invention.

The basic structure of a receiver used in an embodiment of the present invention is shown in FIG. 2. Here, a wideband antenna 115 receives a radio frequency (RF) RF signal and provides it to an RF amplifier 120, and a particular channel or signal within the band is preferably selected by varying the local oscillators 130 and 180. In the embodiment, the RF signal preferably conforms to the IEEE 802.11a standard, has a frequency in the 5 to 6 GHz band and is quadrature modulated to carry 6 to 54 Mbps. In this embodiment, the signal can carry up to 54 Mbits of data or more and lies within one of twelve 20 MHz wide slots, eight within a 5.15-5.35 GHz band and four within a 5.75-5.85 GHz band. The signal in this embodiment is a coded orthogonal frequency division multiplexed (OFDM) signal using 52 subcarriers spaced 312.5 kHz apart. It is understood, however, that while the following detailed description is made in the context of an IEEE 802.11a system, the invention described herein has application to many different types of communication systems, and is not limited to systems operating within the IEEE 802.11a standard. Thus, for example, power measurements can be made based upon half of a period of a slowest frequency sinusoid that exists within a training symbol containing a plurality of sinusoids, with each of the plurality of sinusoids having a frequency that is an integer multiple of the slowest frequency sinusoid. In 802.11a system this translates to half of a short training symbol sequence. Also, for example, as described hereinafter the present invention is described as operating upon the received signal during inter-packet times when the medium is not busy, such as the 802.11a SIFS time explained below.

The amplified RF signal is mixed with a signal from a local RF oscillator 130 supplied to an RF mixer 125 to generate an intermediate frequency (IF) signal that is fed to an IF amplifier 135. Preferably, the sum of the frequencies of the local RF oscillator 130 and local IF oscillator 180 are in the range 5.15-5.35 and 5.75-5.85 GHz, with the ratio of the RF oscillator frequency to the IF oscillator frequency being 4:1. In the embodiment, the local oscillators 130 and 180 are preferably in a floating IF arrangement in which they both are variable, rather than a fixed IF arrangement where, e.g., only the RF local oscillator 130 is variable.

The amplified IF signals are supplied to an in-phase mixer 175-IP and a quadrature mixer 175-Q, respectively. One of the in-phase mixer 175-IP and the quadrature mixer 175-Q is directly driven by a local IF oscillator 180, and the other of the in-phase mixer 175-IP and the quadrature mixer 175-Q is driven by the local IF oscillator signal after it is phase-shifted by 90° in a phase shifter 185. In this way, in-phase (IP) and quadrature (Q) components of the received RF signal are obtained at the outputs of the in-phase mixer 175-IP and quadrature mixer 175-Q, respectively.

The mixed IF signals pass through low-pass filters 140-IP and 140-Q to select the desired channel and remove spectrally distant components not of interest, and are amplified by two series of baseband amplifiers 145-IP and 145-Q. Though two baseband amplifiers are shown in each branch, a different number of amplifiers may be used. Almost any desired baseband gain step arrangement may be developed using baseband amplifiers having appropriately selected programmable gains in a particular order.

Preferably, the low-pass filters 140-IP and 140-Q are two-pole elliptical filters having a 3 dB corner at 28 MHz. Moving from the analog to digital domain, the baseband amplifier outputs are fed to A/D converters 190-IP and 190-Q which digitize the in-phase and quadrature component signals, preferably with a frequency of 80 MHz, to a resolution of nine bits, and an input dynamic range of −500 mV to 500 mV.

Preferably, the A/D converters are pipeline A/D converters; however, the invention is not so limited. For example, sigma-delta or other converters may be used in their place.

An analog channel filter and/or anti-aliasing filter may advantageously be placed before the A/D converters 190-IP and 190-Q. In the preferred embodiment, the combination of the analog filters performs adjacent blocker rejection of 4 dB and alternate blocker rejection of 20 dB. With a worst case of an adjacent blocker 16 dB larger and an alternate blocker 32 dB larger, a received blocker at the A/D converter input can be 12 dB higher than the in-band signal. As is known in the art, an adjacent blocker is an interference signal adjacent to or overlapping the frequency band of interest, while an alternate blocker is an interference signal farther away from the frequency band of interest.

The digitized I/Q component signals are provided to an automatic gain control (AGC) unit 170 whose operation with respect to the present invention will be described in greater detail below. The AGC 170 analyzes the I/Q component signals as described in greater detail below and generates gain control signals based thereon. These gain control signals are provided to the amplifiers 120, 135, 145-IP and 145-Q as shown by the dotted line in FIG. 2.

Figure 3:
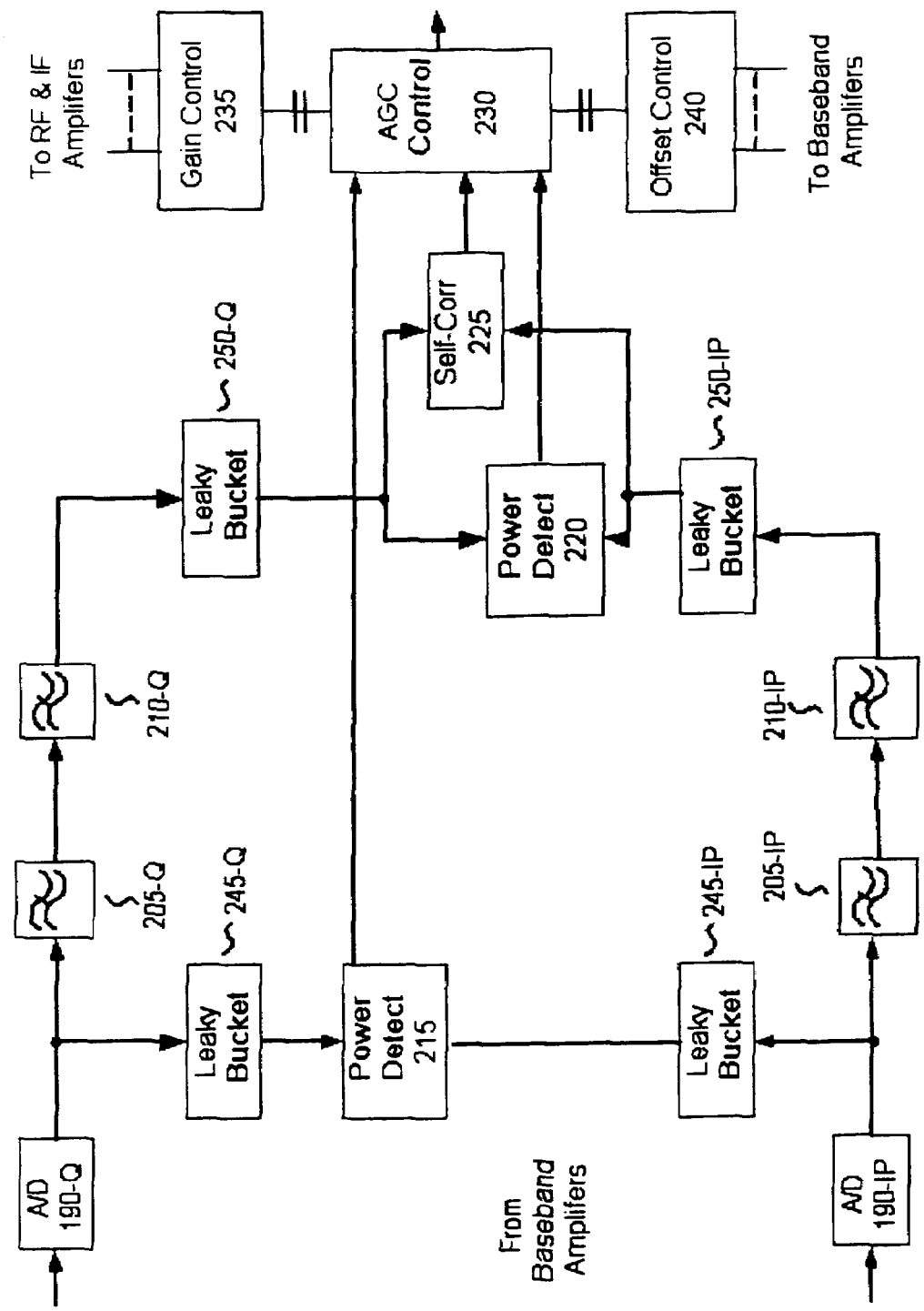
FIG. 3 shows the structure of an automatic gain control mechanism in the embodiment of FIG. 2.

More specifically, as shown in FIG. 3 the digitized IF signals from the A/D converters 190-IP and 190-Q are passed through leaky bucket filters 245-IP and 245-Q and finite impulse response (FIR) filters 205-IP, 210-IP and 205-Q, 210-Q. The first FIRs 205-IP and 205-Q are decimation filters that eliminate every other sample from their respective streams to reduce the data sampling rate from 80 MHz to 40 MHz for a normal 8.5 MHz single-sided bandwidth packet. The second FIRs 210-IP and 205-Q are standard low-pass filters which remove any residual adjacent or aliased blockers before sending the data to the self-correlator 225 and a power detector 220. Two power measurements are taken within the AGC 170—one from the output of the second FIR filter 210 by the power detector 220, and another from the output of A/D converters 190-IP and 190-Q by another power detector 215. These measurements are provided to AGC control logic 230 as will be described in greater detail below.

Although this embodiment uses digital FIRs, other types of filters, including analog filters, may be used in their place. If the system is not oversampled, the filters are preferably analog.

AGC control logic 230 receives the power measurements from power detectors 215 and 220 and uses them to control a gain control generator 235 to output analog gain control signals for each of the RF amplifier 120, the IF amplifier 135, and individual ones of the baseband amplifiers 145-IP and 145-Q. In the embodiment, the AGC control logic 230 provides a control word, ten bits in length in the preferred embodiment, to the gain control generator 235, and the gain control generator 235 generates appropriate control signals for the amplifiers. These gain control signals are fed back to the RF amplifier 120, the IF amplifier 135 and the baseband amplifiers 145-IP and 145-Q to control the gain of each as described above.

The embodiment uses an application-specific integrated circuit to implement the AGC control logic 230; however, an appropriately programmed processor, either embedded or discrete, or other appropriate device, may be used as well.

It should be noted that although FIG. 3 shows various components within the AGC 170 to be separate from one another, it is possible that two or more units may be integrated into one. For example, the AGC control logic 230 is shown separately from the FIRs 205, 210, power detectors 215, 220 and self-correlation unit 225; however, several of these may be combined into a single processor appropriately programmed to perform these functions. Further, a programmed processor need not be used and one or more of these components can be implemented in dedicated hardware.

The AGC 170 may control a DC offset control unit 240 to provide analog offset control signals to one or more of the baseband amplifiers 145-IP and 145-Q. DC offset control is done to ensure that the analog signals provided to the amplifiers and A/D converters 190-IP and 190-Q are properly centered and quantized.

AGC Operation

The control logic 230 first checks to see if the signal is sufficiently saturating either of the A/D converters 190-IP and 190-Q. If so, a quick drop gain control procedure is executed; if not, a base gain control procedure, also described below, is executed.

Next, the AGC base gain control logic 230 determines whether the received signal is within a preferred range as described below. If so, no gain control is needed; otherwise, a gain control procedure described in greater detail below is executed.

Then, the AGC system 170 attempts to identify an in-band signal using strong signal and weak signal detection techniques, as described in greater detail below. If a signal is found, the detection process is complete; if not, the detection process is repeated on the next portion of the signal. Weak signal detection and strong signal detection are independent and complementary features. As described further herein, for strong signal detection, it is determined that a signal may exist by the arrival of a stronger signal necessitating a drop in receive gain, whereas for weak signal detection, it is determined that a signal may exist due to a sudden increase in measured in-band power at least proportional to the increase in total power at the AGC (while not requiring a gain change), followed shortly by a self-correlation exceeding thresholds. It is noted that it is preferable to disable weak signal detection, typically for a few microseconds, if a gain change is made, since self-correlation will not be valid until the entire viewing window for self-correlation is filled with post-gain-change values. Thus, weak-signal detection is used for arriving signals not large enough relative to blockers or noise to cause gain changes, and strong signal detection for larger arriving signals. And for strong signal detection, that a new signal has arrived is determined based upon whether a coarse gain drop or quickdrop gain results, as described below.

AGC Base Gain Control For a Coarse Gain Change

In operation, the AGC 170 must adjust receiver gains so that the received signal can properly be quantized by the A/D converter 190. If this signal is too big at the A/D converter input, the signal will be distorted by saturation. If the signal is too small at the A/D converter input, the quantization noise of the A/D converter 190 will render the received signal-to-noise (S/N) ratio too low for correct detection. For this purpose, the AGC control logic 230 digitally controls the analog variable gain stages mentioned above using the gain control unit 235. Preferably, the embodiment's gain control has a dynamic range of 93 dB–51 dB in the combined RF and IF stages 120 and 135 and 42 dB in the baseband stage 145.

The power detector 215 estimates the total digitized power at the A/D converters 190-IP and 190-Q by summing a window of instantaneous power calculations for half of a preamble short symbol window in an 802.11a signal (400 ns) for a total of 16 samples. For example, consider a signal coming out of a nine-bit A/D converter 190 with a range of [–256, 255], and measurement of power for this signal over a 16-bit sample window in half a preamble short symbol window. To do this, the AGC control logic 230 calculates the instantaneous power adcpwr1 on the A/D converter output stream adcoutput as $$adcpwr1 = 10*\log10\left(\sum_{k=0}^{15} (\text{real}(adcoutput[k]))^2 + (\text{imag}(adcoutput[k]))^2\right) \quad (1)$$

This power measurement is then put into a log table, where its maximum value is zero. Thus, for a fully railed output with every value at –256, the logarithmic table output would be zero. The power of a full-rail sinusoid would be −3 dB; if every sample were 128, the power would be −6 dB, etc.

Figure 4:
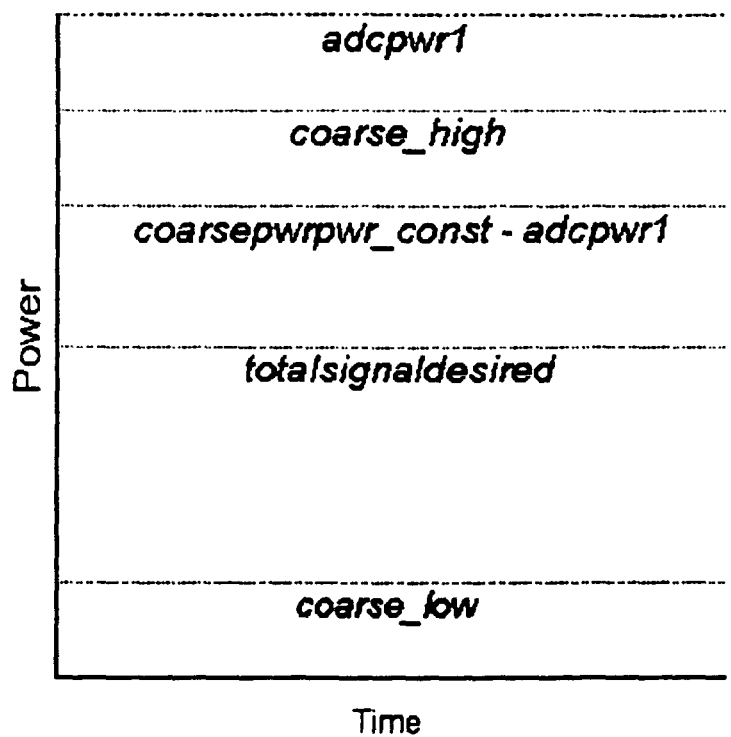
FIGS. 4 and 5 show desired characteristics of a gain-controlled signal.

The AGC control logic 230 uses this total power estimate to keep the signal in-range at the A/D converters 190-IP and 190-Q. If the signal power is determined to be out of range (but not saturating the A/D converters 190-IP and 190-Q), a coarse gain change will be made to put the signal back in range. More specifically, if AGC control logic 230 detects the total measured power adcpwr1 (in the embodiment, within the range −63-0 dB) is greater than the maximum desired A/D converter signal size, the desired gain value gaintarget, which is a signal size that is set large enough so that quantization noise is small enough, but also small enough that ADC saturation is not an issue, including the size of the signal and any potential blocker, is reduced in a course gain drop by the AGC control logic 230 of the equation $$gaintarget=gaintarget+(coarsepwr\_const-adcpwr1) \quad (2)$$

where coarsepwr_const is an additional gain for coarse gain drop (FIG. 4), e.g., −17 dB. This additional gain loss is used because the incoming signal may be too large to quantize but not large enough to trigger a quick drop as described in greater detail below—for example, if the signal saturates occasionally but not enough to trigger a quick drop. In such cases, it is useful to drop the gain by more than the gaintarget value indicates, based on power measurements of a saturated waveform—a very aggressive drop. Thus, the empirically determined coarsepwr_const value is added to increase the gain drop to more quickly converge on the desired signal size. The result is used to generate appropriate control signals for the amplifiers via the gain control generator 235.

Figure 5:
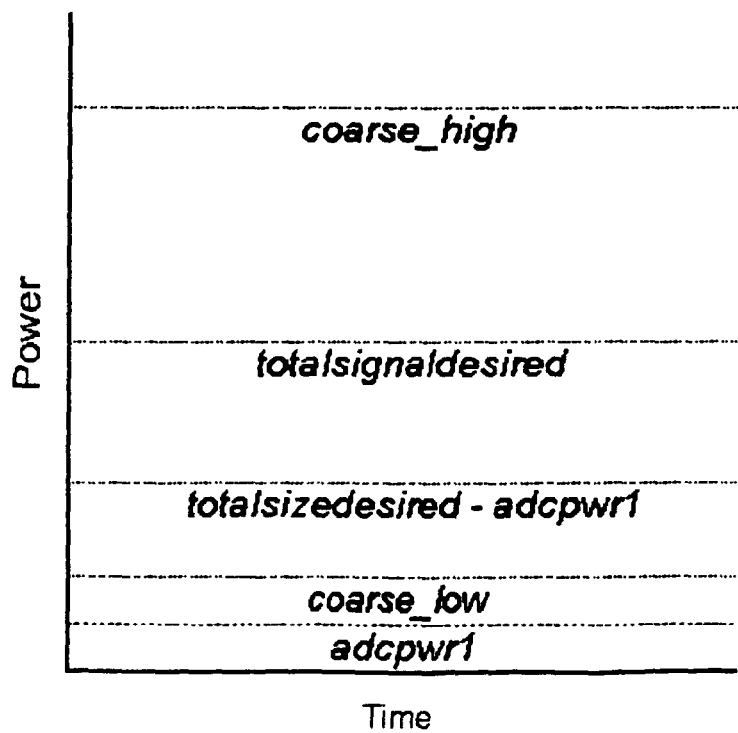

If the total measured power adcpwr1 is less than the minimum desired A/D converter signal size, the desired gain value gaintarget is increased by the AGC control logic 230 of the equation $$gaintarget=gaintarget+(totalsizedesired-adcpwr1) \quad (3)$$

where totalsizedesired is the target A/D converter signal size during coarse gain changes, i.e., the desired size of the A/D converter output in the absence of a desired signal (FIG. 5)—about −17 dB in the preferred embodiment.

AGC Quick Drop Gain Control

Figure 6:
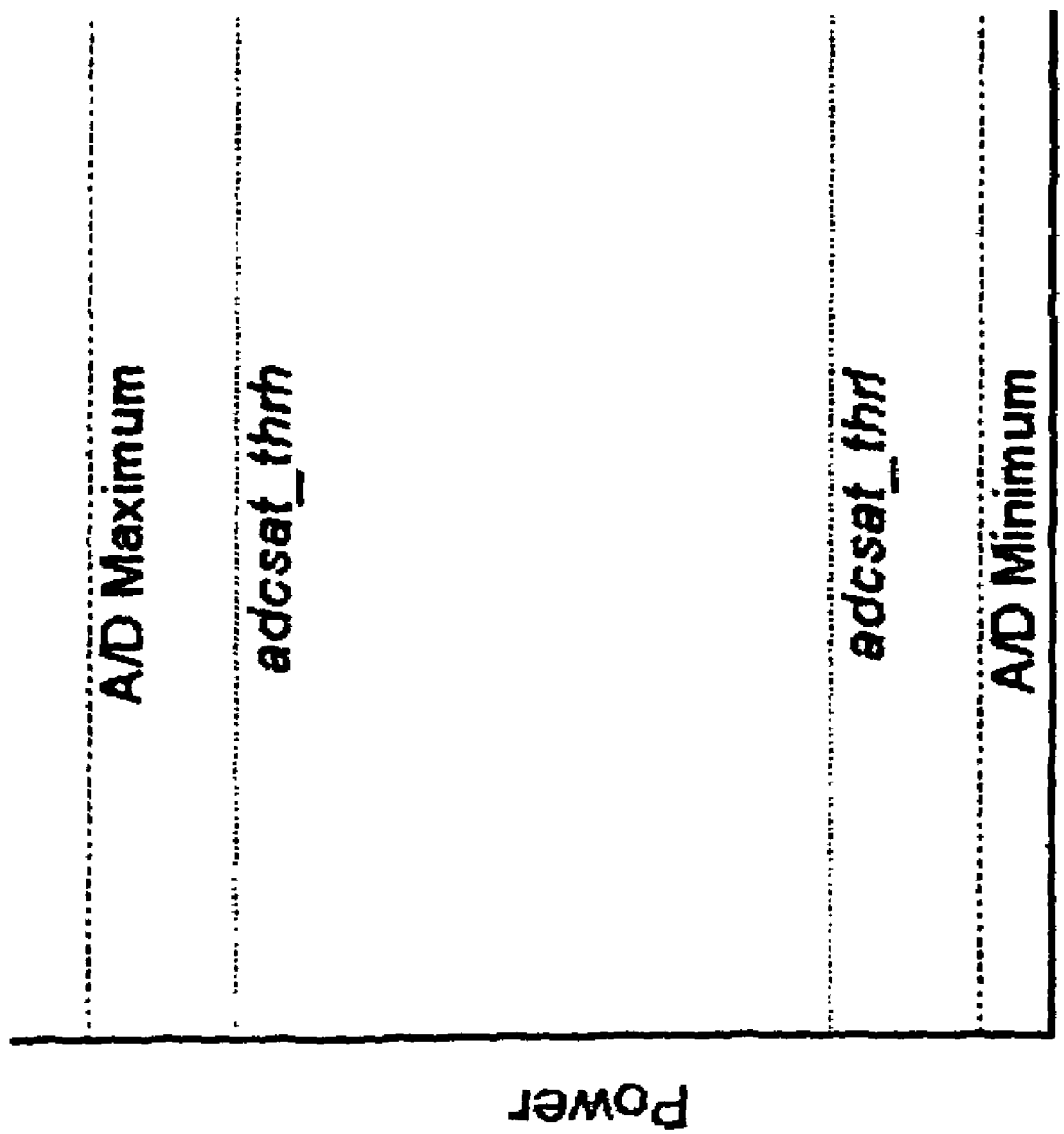
FIG. 6 shows characteristics of A/D converter saturation in the embodiment.

If the received signal is saturating the A/D converters 190-IP and 190-Q often, a precise power measurement may not be obtained; however, it is certain that the signal is well out of range. This information can be used to quickly reduce the gain. More specifically, a saturation counter adcsat is established by the AGC control logic 230 to count the number of saturations of either the I or Q A/D converter output samples. A pair of saturation thresholds adcsat_thrh and adcsat_thrl, which can be changed by downloading a different threshold, are used to counter any possible lack of A/D converter range. Thus, a saturation will be detected if $$adcoutput \geq (adcsat\_thrh+192) \quad (4)$$

or if $$adcoutput \leq (adcsat\_thrl-256) \quad (5)$$

where adcsat_thrh is a high threshold less than the maximum A/D converter output value which designates saturation on the high side of the A/D converter output, adcsat_thrl is a low threshold value greater than the minimum A/D converter output value which designates saturation on the low side of the A/D converter output (FIG. 6) and the constant values are implementation-dependent. adcsat_thrh is set to be slightly less than the maximum A/D converter output, while adcsat_thrl is set to be slightly higher than the minimum A/D converter output. This is useful because it allows signals that are close to saturation of, but do not actually saturate, the A/D converter to be classified as saturation signals for more flexibility. If the number of saturations of the A/D converter output samples during a sample window of adcsat_icount cycles (preferably less than or equal to eight, the number of cycles in the quarter-symbol 802.11a measurement window) exceeds a saturation threshold amount adcsat_thresh a quick gain drop is instructed by the AGC control logic 230, and gaintarget is reduced by a predetermined amount quick_drop, e.g., a −30 dB change in gain. In a preferred embodiment, the adcsat_thresh is set for at a threshold of 12 saturations in an 8-cycle window (with saturations independently possible on I and Q ADCs).

This technique may advantageously be implemented in the following way. After calibration or any gain change, an AGC settling time occurs. After that adcpwr1, the variable corresponding to the amount of measured power, is reset and an acc_count counter, preferably an eight-bit incremental counter cycling continuously during AGC operation, also is reset.

The following events will happen of the counter acc_count:

mod(acc_count, 16)=0: reset adcpwr1 accumulator mod(acc_count, 16)=1: clear reset on adcpwr1 accumulator mod(acc_count, 16)=2: store adcpwr1 mod(acc_count, 16)<adcsat_icount and adcsat=1 (asserted when set_thresh saturations, e.g. eight saturations, have been counted), the saturation counter has exceeded adcsat_thresh and a quick gain drop should be executed. As shown, in the preferred embodiment, the adcpwr1 values are computed every 16 cycles, and the system looks for adcsat to be asserted prior to the first 4 bits of the counter registering a value greater than adcsat_icount (preferably 8).

AGC Packet Detection

Once the received signal is in-range, the AGC control logic 230 detects the presence of a desired packet. For this purpose, the AGC control logic 230 determines an in-band power estimation, uses the FIR filters 205-IP, 210-IP and 205-Q and 210-Q to reduce all adjacent and alternate blockers to 20 dB below the in-band signal power at 802.11a specified maximum levels, and compares adcpwr1 and firpwr1 as described hereinafter. This is done to obtain information about whether quantized signal energy at the A/D converter 190-IP or 190-Q is in-band or out-of-band—information which helps in finding the desired packets.

Figure 7A:
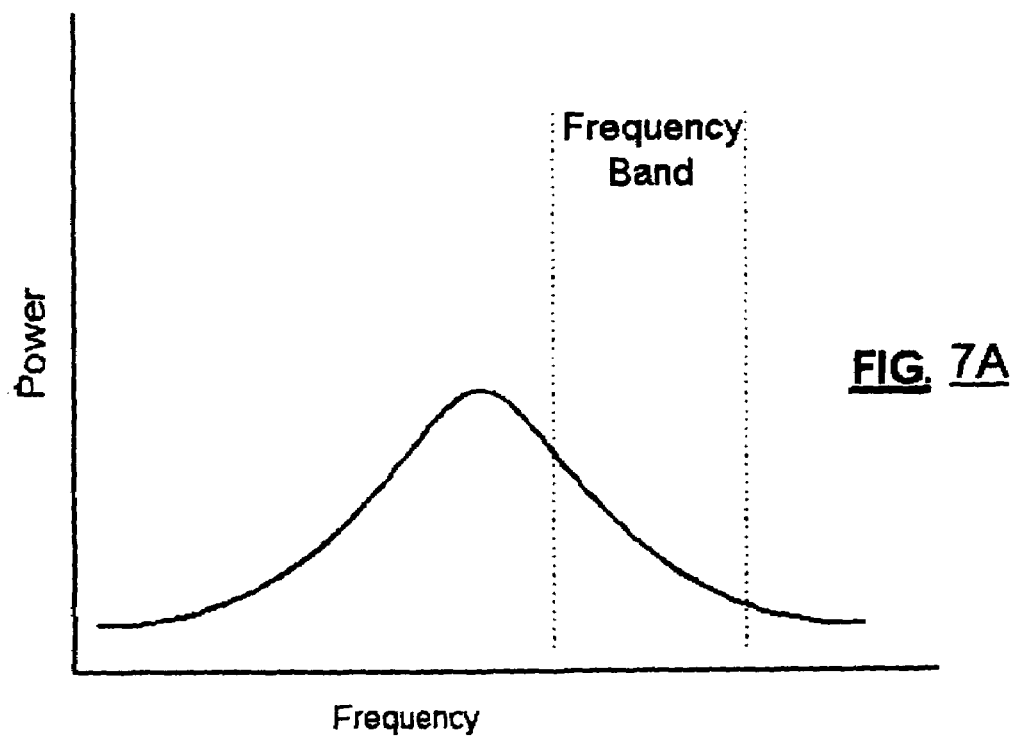
FIGS. 7A, 7B, 8A and 8B show characteristics of in-band and out-of-band signals.
Figure 7B:
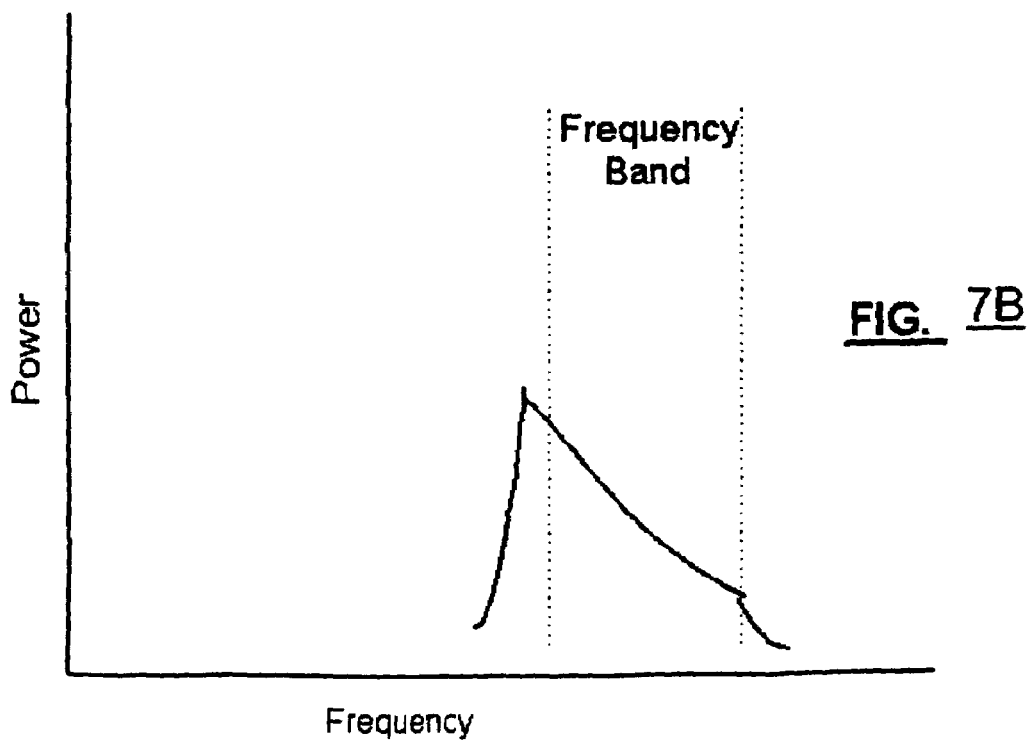

More specifically, consider the signal shown in FIG. 7A. Calculating the power of an A/D converter output as described above might determine that it has an overall power of, say, −12 dBr, where dBr is a measure of the RMS size of signals below the full rail signal size described above with reference to Equation (1). Passing through the second FIR 210-IP or 210-Q as shown in FIG. 7B, however, the signal loses most of its power and is reduced to a level of about −25 dBr—a decrease of roughly 85%. Since most of the signal's power was blocked by the bandpass FIR 210-IP or 210-Q, it is presumed to be an out-of-band signal.

Figure 8A:
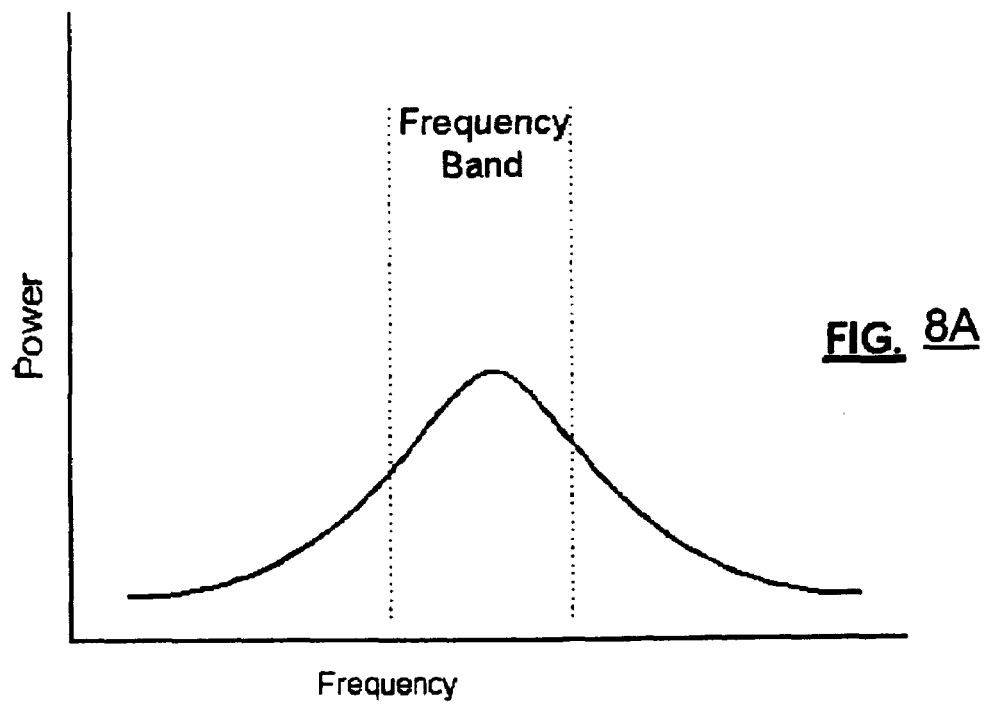
Figure 8B:
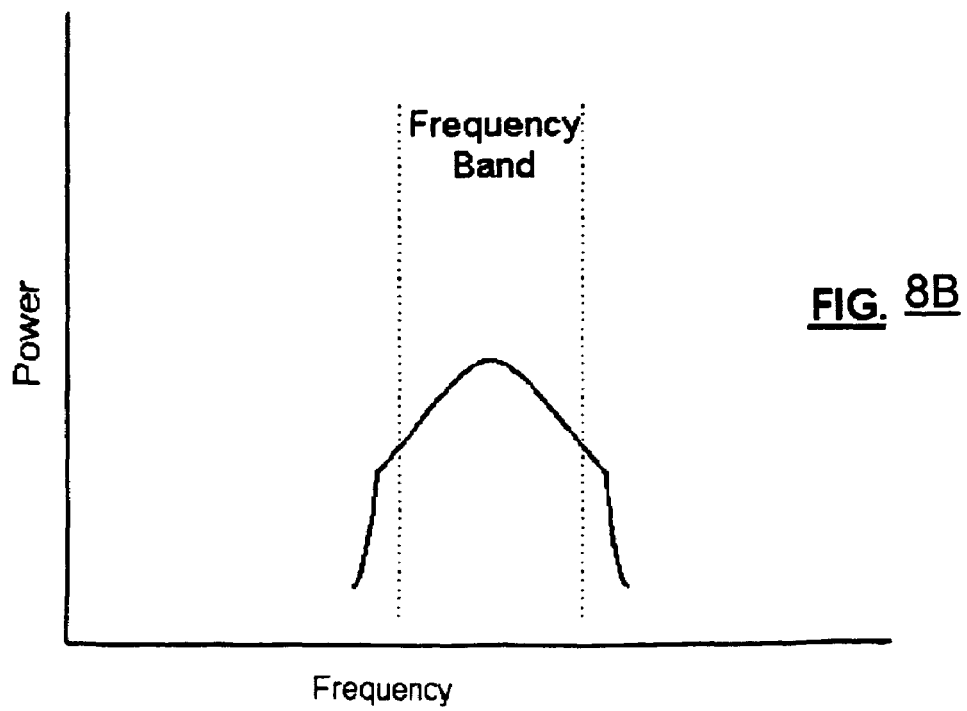

Referring to the signal shown in FIG. 8A, this signal too has an overall power of about −12BDr as measured at the A/D converter output. Passing through the second FIR 210-IP or 210-Q as shown in FIG. 8B, however, only reduces its power to approximately −15 dBr—a decrease of only about 10%. Since most of the signal's power was passed by the bandpass FIR 210-IP or 210-Q, it is presumed to be an in-band signal.

The in-band power is preferably calculated as the sum of instantaneous power measurements, preferably in a 32 sample, 0.8 µs window similar to the overall power calculation adcpwr1 described above. firpwr1 is the power based on the lowest of some number of samples that is less than the entire number of samples obtained, such as 28 out of 32 samples in the 32 sample window in detector 220. It is noted that the number of samples for firpwr1 is greater than the number of samples for adcpwr1 because firpwr1 is being used for fine gain control, where precision is important, whereas adcpwr1 is being used for coarse gain changes, where a slightly noisy power estimate will do. It is also noted that while for purposes of this in-band power calculation less than the entire number of samples is preferably used, that other post analog to digital converter processing that takes place using such samples will typically use all the samples obtained.

Thus, less than the entire number of samples is used because during periods of interference, e.g., at symbol boundaries of the interferers, a temporary in-band power spike may occur due to high-frequency components of interferers at the symbol transition becoming in-band components in the desired band. This will artificially show up as a step in the in-band power. Windowing at the transmitter of the interferer, e.g., using a value which is half the previous value added to half the subsequent value at the symbol boundary, reduces this somewhat, as does lowpass filtering, so that the aggregate spectrum passes the necessary spectral mask. These instantaneous high frequency peaks, although lowered, can still exist. When an adjacent interferer is present, this temporary high frequency component in the interferer is actually in-band for the desired signal, so that the in-band power measurement when no desired signal is present can get a quick spike for a few samples, looking like an increase in the in-band power. To combat this, the lowest 28 of the 32 samples are used so this temporary spike is nulled out by not counting those values, and thresholds are adjusted accordingly to compensate for the reduced power measurement due to the missing four samples. Once a signal of interest is present, however, all samples are preferably used in creating the power measurement to make a detailed measurement. This second power measurement is called firpwr_all. Using the power information described above, desired signals can be found in two ways: strong signal detection and weak signal detection. Strong signal detection will be described first.

Strong Signal Detection

Any time a coarse gain drop or quick gain drop as described above occurs, a flag strongsignal is set by the AGC control logic 230. This flag remains high until the signal is determined to be in range at the A/D converter 190-IP or 190-Q, and the algorithm proceeds to make a firpwr1 measurement as described above. At this point, flag_relpwr is calculated as flag_relpwr=set if (firpwr1>relpwr+adcpwr) (6)

(where relpwr is an empirical thresholding variable related to the absolute digital size of the in-band signal relative to the absolute total digital signal at the A/D converter 190-IP or 190-Q), thus attempting to see that most of the computed power is in-band. If flag_relpwr is high and strongsignal is high, then a new, very strong in-band signal has appeared. In this way, the embodiment permits examination of an oversampled incoming signal having digitized frequencies beyond a desired frequency range due to oversampling, and determine whether most of its power is in-band before determining that a desired signal has been found.

Thus, when flag_relpwr is high and strongsignal is high, the signal_found flag is asserted, a fine gain change is made as described below and the AGC process is completed once the number of consecutive gain changes is equal to or greater than the minimum number of gain changes deemed to constitute a successful AGC operation, i.e., when there have been enough gain changes to ensure a full programmable amplifier ramp-up when the system is turned on.

Weak Signal Detection

In weak signal detection, the normalized self-correlation of short sequences as defined below is measured to look for anything in-band with a periodicity of 0.8 µs in the preferred embodiment. This is a two-step process performed concurrently with the above-described strong signal detection process. First, the system waits for the normalized self-correlation as measured by the self-correlation processor 225 to exceed a first normalized self-correlation magnitude threshold value m1thres.

The self-correlation processor 225 preferably measures self-correlation of 802.11a packets by taking 32 samples in a short training symbol at the beginning of a packet and comparing each of the samples to a corresponding sample from the preceding short training symbol. More specifically, the self-correlation of an A/D converter stream adcoutput is given by $$\text{self\_corr} = \frac{[\Sigma adcoutput[n] \cdot conj(adcoutput[n-32])]^2}{\Sigma adcoutput[n]^2} \quad (7)$$

where the denominator is a normalization factor. One can see that the numerator will be relatively high when x[n] and x[n−32] are identical and relatively low when, e.g., they are uncorrelated. Thus, this measure can serve as a good indicator of self-correlation.

Detecting when the self-correlation output exceeds m1thres can thus detect the existence of an incoming packet; however, it would also detect interferers, since they can have structures that can also self-correlate. For this reason, the embodiment advantageously employs another test. Once the normalized self-correlation exceeds m1thres, the system enters a loop and for m1count_max cycles counts in a variable m1tally the number of times the normalized self-correlation exceeds a second normalized self-correlation magnitude threshold value m2thres, where m2thres is less than or equal to m1thres. If m1tally>m2count_thr, a threshold of the count of normalized self-correlation>m2thres, before m1count_max (a window length for the self-correlation count) cycles have elapsed, weak signal detection may be detected.

As noted above, the windowing technique based on m1count_max is used because both interferers and noise may have a self-correlation that momentarily exceeds a threshold, but the chances of this occurring diminish when windows of samples obtained over consecutive periods of time are used. For example, a subsequent window will contain many of the same samples as the previous window, but the previous window will not contain the most recent sample from the subsequent window, and the subsequent window will not contain the oldest sample from the previous window. Thus, for example, if two 802.11a symbols in adjacent channels are sent, such that they are separated in frequency by 20 MHz, the last 0.8 µs of the first symbol will exactly match the next 0.8 µs guard period of the next symbol, creating self-correlation, but this spike will rapidly fade, in comparison with a preamble where a flat normalized self-correlation result is expected for the preamble duration.

Thus, the embodiment provides a way of performing a two-threshold windowing process on a self-correlation measurement. One threshold is used to determine that a signal may be present in-band, and the number of times a second threshold is exceeded in different windows of offset samples is counted to further determine if that in-band signal is a desired signal. This is done to combat temporary correlation of thermal noise as well as to combat self-correlation during the data segment of an interferer.

Additionally, for further robustness against thermal noise and interferers, the embodiment preferably requires that to enable a weak signal detection result, a potential detected packet must increase the in-band signal power by at least a certain amount and that the increase be at least proportional to any increase in the total signal power, the signal power being of at least a certain minimum size. This provides extra sensitivity when a new in-band signal comes in below an interferer or near the noise floor, thus not triggering strong signal detection but worthy of a look for weak signal detection.

At least three things may stop weak signal detection from occurring once m1tally>m1thresh. First, if ycOK=0, weak signal detection will not occur. ycOK is a decrementing counter that is reset to ycOKmax (in the embodiment, four) to enable weak signal detection if it is determined that an increase in the in-band signal of a certain size (flag_firstep) and at least proportional to any increase in the total power (flag_relstep) with the measured firpwr1 of at least a certain minimum size (flag_firpwr), then it is possible that a new in-band signal has come in below an interferer or near the noise floor, thus not triggering strong signal detection but worthy of a look for weak signal detection. To ensure that such recognition occurs within a limited period of time, the above must happen while ycOK>0 if it happens at all. To perform these step calculations, old values of firpwr1 and adcpwr are stored as firpwr{2-4} and adcpwr{2-4}. Enough values are stored so that if the signal is detected during a programmable amplifier ramp, enough difference will exist between the first and last measurements to exceed the given threshold.

Another reason why weak signal detection might not occur is because gc_count is greater than zero. gc_count measures the time since the last gain change in short symbol increments, getting decremented by the AGC control logic 230 for every valid firpwr1 measurement from its starting value of three after a gain change. The idea is that after a gain change, there is a minimum amount of time until a self-correlation is valid.

Finally, weak signal detection will not occur if the signal has already been found with another method, since then there is no need to find it using weak signal detection.

AGC Packet Detection—DC Offset Elimination

The above double threshold arrangement is successful in reducing false packet detects on interferers during weak signal detection; however, it is not particularly successful in preventing false detection with respect to DC signals, which always self-correlate. There is typically a small DC component at the output of the A/D converter 190, so the embodiment uses a two-tap DC notch filter as a leaky bucket filter—more specifically, a two-tap IIR filter having a transfer curve of the form $$y[n] = \frac{\alpha - 1}{\alpha} y[n-1] + \frac{1}{\alpha} x[n] \qquad (8)$$

where x is the input signal, y is the output signal and a is a filter parameter (in this case, 32)—which uses an estimate of the DC level provided by the AGC logic control 230 to cancel the DC component out. The AGC control logic 230 obtains this level from a lookup table based on current gain settings.

AGC Completion Processing

Once the signal is found via either strong signal detection or weak signal detection, fine gain changes will be made, in the preferred embodiment if consec_gainchanges<min_gainchanges. And in the preferred embodiment, every fine gain change will be made based upon the equation $$gain\_change = adc\_desired\_size - firpwr1\_all \qquad (9)$$

consec_gainchanges begins at zero for strong signal detection and two for weak signal detection, since it is meant to be a coarse measure of time spent in the AGC, and it takes approximately two gain change times to perform a windowed self-correlation. It is incremented every coarse and fine gain change. It is reset when no gain change is made and strong signal detection does not decide that a signal is present. This feature is meant to ensure that a minimum amount of time is spent in the AGC, for either more precise gain or to be sure the gain is set after the PA is done ramping.

Noise Floor Calibration and RSSI Computation

Figure 10:
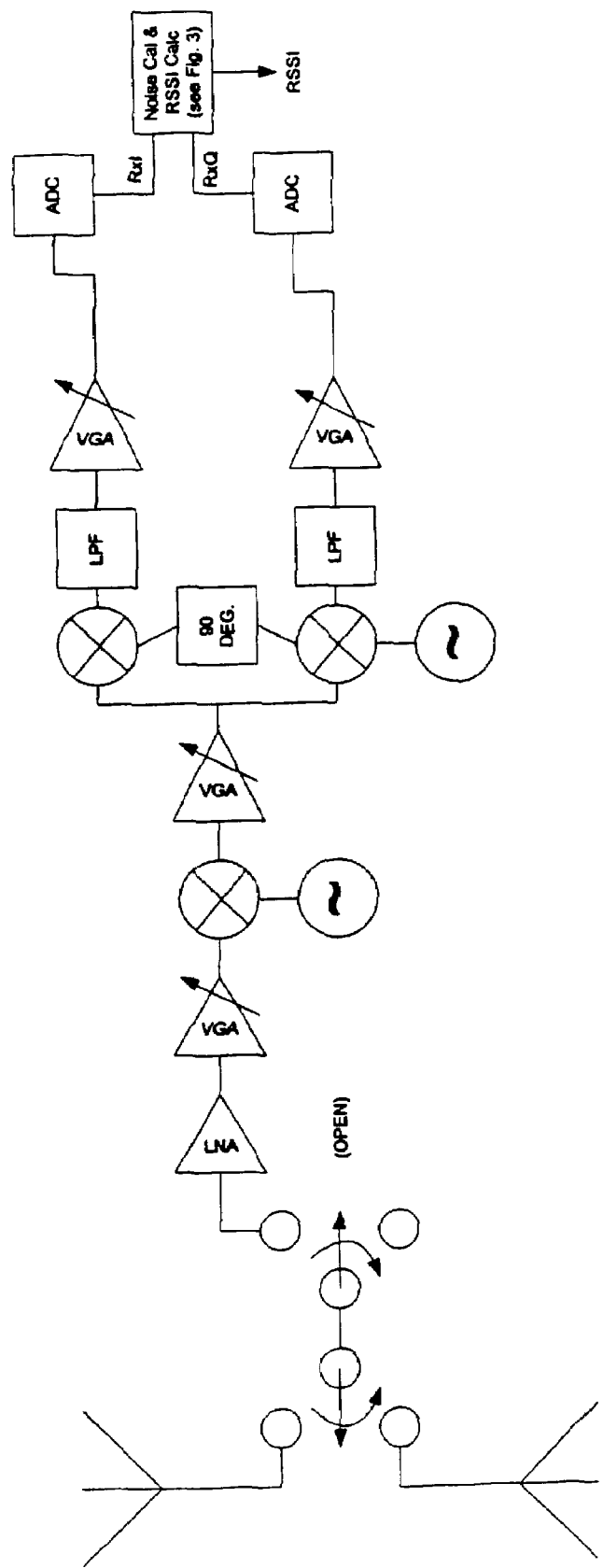
FIG. 10 is block diagram of a receiver providing the inventive system and method for accurately obtaining RSSI.

A block diagram of a receiver employing the inventive method for accurately obtaining RSSI is provided in FIG. 10. As illustrated, no additional circuits for determining the RSSI are required beyond those needed for normal signal reception. Further, the inventive technique does not require absolute accuracy in the gain of the receive chain, and is therefore better suited to implementation using low cost CMOS technology than available methods. Instead, any stage in the receive chain that has variable gain should preferably also have accurate relative gain steps. For example, if a stage has a high and low gain setting, the difference between the two settings should preferably be known and consistent, even if the absolute values of the two gain settings are unknown. Since gain steps can often be built based on size and feature ratios of physical devices, it is much easier for CMOS technology to provide consistent relative gain steps than absolute accuracy in the gain itself.

The inventive system uses the noise floor of the circuit itself as a calibration signal to calibrate the receiver to absolute power level. It is known that the noise power level N at the antenna can therefore be calculated as:

$N=KTW$, where:

N is the noise power in watts

K is Boltzmann's constant

T is the temperature expressed in kelvin

W is the bandwidth in Hz

The noise floor observed at the ADC will be due to this thermal noise floor plus the effect of the circuit noise of the receiver. This additive effect on the noise floor is often referred to as the noise figure (NF) of the receiver, so that the noise floor observed at the ADC, $N_{ADC}$ may be calculated as:

$$N_{ADC} = KTW(\text{in dBm}) + NF \qquad (10)$$

Because the input noise of the circuits (the noise figure of the receiver) is much more consistent than the absolute gain of the circuits, this method of calibration significantly improves the resulting accuracy.

The basic operation of the preferred embodiment is as follows. During the calibration, the receive/transmit switch is placed in an open position (as well as the antenna diversity switch if there is one), providing attenuation of signals coming from the antenna and thereby helping to insure that the receive circuit is isolated such that the measured noise is only the circuit noise and the measurement is made in a manner independent of the environment in which the calibration step is done.

Next, the receiver is allowed to run freely, such that, since no large signal is coming in via the antenna, the coarse gain changes will cause the analog front end to be configured into a high gain state (as described above). This will allow the in-band circuit noise to be measured accurately after all filtering, insuring that the circuit noise measured is dominated by the noise of the first stage of amplification (the LNA in FIG. 10). This circuit noise is measured as the in-band signal size, as shown for the Power Detect 220 block in FIG. 3, as:

$$firpwr256 = \qquad (11)$$
$$10 * \log 10 \left( \sum_{k=0}^{255} (\text{real}(fir2output[k]))^2 + (\text{imag}(fir2output[k]))^2 \right)$$

$$\text{antenna\_power\_256} = firpwr256 - rfgain - bbgain + rxtx\_flag * txrxatten \qquad (12)$$

Value antenna_power_256 is a relative measure of the signal size at the antenna—the same signal at the antenna could produce a larger signal at the ADC, and hence after the FIRs, with a larger amount of analog variable gain. Therefore, to get an accurate measure of the signal size at the antenna, the variable gain used must be subtracted from the digital signal size. In this way, we can create an accurate differential measurement of power at the antenna given an unknown amount of fixed gain but a known amount of variable gain in the analog chain.

Despite the attenuation through the open Tx/Rx and diversity switches, strong signals among other devices in a wireless network could reach the receive chain and corrupt the noise measurement. Measurements of the noise are therefore performed so as to minimize the likelihood that they will be corrupted by regular network traffic. The preferred embodiment of this measurement corruption avoidance is to calculate the noisefloor as the minimum of a sequence of num_noisefloor_measurements measurements of antenna_Power_256. Since the receiver is operating as it normally does, any signals detected will be processed as they normally would. In the case of the arrival of a packet of network traffic, this packet will be detected and processed, turning the AGC off after signal detection and stalling the count of the number of noisefloor calculations to make. This automatically allows the system to measure for a longer absolute amount of time in a busy network, and further to only attempt to measure during periods where no known transmissions are occurring. FIG. 3, described above, illustrates the processing performed in the digital domain to obtain the noise calibration result.

It is also possible to avoid interference from network traffic in most packet radio systems since there are brief gaps between the packets during which no nodes are transmitting. For example, in a system compliant with the 802.11a standard, at least a Short Inter-frame Spacing (SIFS) of 16 µs exists between all packets on the network. During this time no devices are allowed to transmit and the network is silent. By accumulating the measured noise over windows that are shorter than the inter-packet gap, an uncorrupted measurement is ensured. However, these windows are also long enough to provide sufficient averaging to insure that the random fluctuation in the measured noise is low. For example, in the preferred 802.11a-compatible embodiment, each noisefloor is calculated from 256 samples at 40 MHz, giving a standard deviation of power measurements of well under 0.5 dB. It is also short enough, since it only takes up 6.4 µs, less than half a SIFS, thereby guaranteeing that even with a random measurement starting point, a whole measurement will occur during any SIFS period.

Other standards that may also be utilized, including any of 802.11b, 802.11g, Atheros 802.11a turbo mode (an 802.11a based proprietary standard that comprises an 802.11a communication having a double rate of transmission and a double digital clock rate, an SIFS time of 8 us and DIFS of 20 us), another 11a high rate standard, or other standards and protocols. Example sampling frequencies include, 22 MHz, 44 MHz, and 80 MHz respectively for each of 802.11b, 802.11g, and Atheros turbo mode. Again, the number of samples is preferably 256, but may be any number of samples that can provide a statistically accurate average.

Other gap periods may also be utilized. For example, DIFS+SLOT times are available for measurements in-between packets. The DIFS+SLOT times compare to the SIFS times in that the SIFS times comes between a packet and it's acknowledgement (ACK), while a DIFS+(0 to N)*SLOT comes between an ACK and the next packet. This terminology applies mainly to 802.11 networks, as will be apparent to the ordinarily skilled artisan, similar gaps or time periods are available in other network types or protocols, which would then be described using terminology consistent with that network type or protocol. Furthermore, the frequency of sampling may also be adjusted dependent upon the protocol used or other factors.

Because such gaps may be infrequent and occur at unknown times, the measurements are taken repeatedly over a long period of time. Even if there are multiple networks operating in the channel, probabilistically there will eventually be a time when both networks are silent. Therefore, the circuit preferably saves the lowest power detected in a single measurement window across the entire measurement duration. A programmable value of num_noisefloor_measurements allows the system to perform enough measurements to be assured of a valid noisefloor measurement during a time without any transmissions on a busy medium. Conversely, a short window of measurements can be chosen in a mostly free medium to keep a bias from occurring due to taking the minimum of many valid measurements. The value of num_noisefloor_measurements may be further adjusted based on other statistics as well, such as the amount of consecutive time spent calibrating (as in the case of an empty channel), or number of SIFS gaps detected after valid packets. Once num_noisefloor_measurements have been made, the old value of noisefloor is replaced with the new value of noisefloor for continuity—if we attempted to use a value of noisefloor before it had settled, our results would not be accurate.

Once the circuit noise floor has been measured, that value can be normalized to the level that the circuit noise is known to have at the end of the analog receive chain, $N_{ADC}$. The circuit noise level can be calculated from the noise figure of the receiver and the receive bandwidth, as described above with regard to equation (10). Since the noise figure varies only a small amount over process and temperature, the calibration yields accurate absolute power levels. Moreover, the noise figure may be stored in the software associated with the radio, in which case it would be the same for all units. Or, the noise figure can be measured and then stored in a non-volatile memory within the unit, in which case the noise level can be different for each unit.

The normalization factor that translates the measured circuit noise to the known circuit noise level at the input to the receive chain can then be used to normalize all subsequent RSSI measurements. It should be noted that if the receiver gain setting is changed from the setting for which the circuit noise calibration was done, then this change must be factored into the RSSI result as well. To accomplish this, when a firpwr1 measurement is recorded as described above, the received signal strength indicator (value RSSI) is calculated as:

$$RSSI=(firpwr1-rfgain-bbgain+rxtx\_flag*txrxatten)-noisefloor \quad (13)$$

This RSSI value will be updated upon every firpwr1 measurement during AGC search mode, and can be used to determine if the medium is busy based on its value relative to a threshold (preferably programmable). For example, in an 802.11a-compatible embodiment, any signal above −62 dBm must cause the circuitry to deem the medium busy, and such an RSSI threshold could be set to this end. The value RSSI will also preferably be held after AGC_done is asserted, and passed to the software along with the data, so that the software may perform channel monitoring or rate adaptation or use the information in some other way.

In one embodiment, the RSSI is calculated every 32 cycles in search mode, and again when the gains have settled down, and right before the final gain change for an incoming packet. The RSSI value is then held for the duration of the packet, assuming that the power will not change, and the power measurements are suspended. In another embodiment, the power continues to be measured, and RSSI calculated every 32 cycles during the receipt of the packet. Continued RSSI measurements allow for detection of changes in the receive strength of the packet during it's duration, which may then be utilized for other functions in the radio.

If the receiver gain settings do not have well-controlled relative gain, then the rfgain or bbgain values may be inaccurate. In that case the noise floor calibration can be manually done at each of the gain settings. However, at low gain settings the noise may become so small that it cannot be measured, or may become dominated by the noises at later points in the chain such that an assumption of a constant noise figure is incorrect.

The above-described calibration procedure can also be employed to find the noise floor not of the receive circuit itself, but of the environment. In this case the Tx/Rx switch would be in the Rx position, and one of the antennas would be connected via a diversity switch, if applicable. Statistics are accumulated in the manner described above, such that even if there is packet communication in the environment the true noise level floor will be found. Unless there is a continuous noise source in a given environment, the result of a noise floor measurement will be the same as that for the noise calibration. Therefore, in environments with no continuous interference or noise sources, any noise floor measurement can be used as a noise calibration using the method of the present invention.

Since the noise floor measurement can take a significant period of time to execute, it is advantageous to be able to execute while the unit is in normal operation. This is possible with the method and system of the present invention since the noise floor measurement is done with the antenna connected.

For some preferred embodiments of the analog receive chain of the present invention, the fixed gain of the receiver may vary with temperature in a predictable way. Thus, if the temperature of the chip is known, the value of the differential measurement noisefloor could be modified based on this knowledge. This change in temperature of the chip may also affect the performance of the analog chip in other ways, such that it would be beneficial to know the temperature of the chip for multiple reasons. In such a case, if there does not exist any circuitry to determine the temperature of the chip, the change in the absolute value of noisefloor will reflect the change in temperature, so that this knowledge of temperature change can be used to correct other aspects of the analog chip.

In a preferred embodiment, this system of RSSI calculation can also be used in testing of systems, especially in manufacturing testing. In this case, a signal of a known absolute input size can be put into the receiver, and the output RSSI value compared to an expected RSSI value. In the case of a receiver with a larger than expected noise figure, the output RSSI measured will be systematically lower.

The preferred embodiment of the invention therefore provides the following advantages:

No additional circuitry beyond the receive chain elements is required.

No special calibration signals are required.

U Absolute accuracy in the gains of the receive stages is not required.

Absolute accuracy in the signal size measurement circuitry is not required.

The inventive system and method works after all channel filtering, whether analog or digital. The RSSI values will therefore be minimally perturbed by signals in adjacent channels.

Calibration is done at a high gain setting, similar to the setting that would be used for weak signals where the RSSI value accuracy is most important.

The calibration system can also be used for measuring the noise floor in a given channel.

In environments that do not have continuous interference or noise, the noise calibration can be done while handling live network traffic.

The embodiments described above have been presented for purposes of explanation only, and the present invention should not be construed to be so limited. Variations on the present invention will become readily apparent to those skilled in the art after reading this description, and the present invention and appended claim outline is intended to encompass such variations as well.

What is claimed is:

1. A method, comprising the steps of:
measuring an apparent strength of a radio communication signal received by a radio circuit at a first stage of a digital portion of a receive chain;
measuring a strength of noise received and generated by the radio circuit at a second stage of the digital portion of the receive chain;
calculating a strength of the radio communication signal based at least in part upon the apparent strength of the radio communication signal and the strength of noise received and generated by the radio circuit; and
substantially electrically isolating the radio circuit from an antenna to measure the strength of noise generated by the radio circuit.

2. A method, comprising the steps of:
measuring an apparent strength of a radio communication signal received by a radio circuit at a first stage of a digital portion of a receive chain;
measuring a strength of noise received and generated by the radio circuit at a second stage of the digital portion of the receive chain; and
calculating a strength of the radio communication signal based at least in part upon the apparent strength of the radio communication signal and the strength of noise received and generated by the radio circuit,
wherein said step of measuring the strength of noise comprises measuring a strength of noise at an ADC of the radio circuit and subtracting an amount of gain in the radio circuit prior to the ADC from the strength of noise received and generated by the radio circuit.

3. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit,
wherein said step of measuring the strength of noise comprises measuring a strength of noise at an ADC of the radio circuit and subtracting an amount of gain in the radio circuit prior to the ADC from the strength of noise received and generated by the radio circuit,
wherein said measuring a strength of noise at the ADC comprises detecting power of an in-band signal size by calculating power at a FIR filter; and said in-band power comprises,
firpwrN=10×log10 (Sum k=0 to N−1 of (real (fir2output [k]))$^2$+(imag(fir2output[k]))$^2$),
where fir2output represents an output of the FIR filter.

4. The method according to claim 3, wherein N is a sufficient number of samples to provide a statistically accurate in-band power.

5. The method according to claim 3, wherein N is 256.

6. The method according to claim 3, wherein said step of measuring a strength of noise comprises,
antenna_power_256=firpwr256−gain+atten,
where gain is a total gain up to the firpwr256 measurement and atten is a total 5 attenuation up to the firpwr256 measurement.

7. The method according to claim 6, wherein said total attenuation comprises all non-fixed attenuation that occurs prior to where the firpwr measurement is made; wherein a fixed attenuation affects both strength of noise and strength of radio signals equally.

8. The method according to claim 6, wherein said total attenuation comprises attenuation of an Rx/Tx switch.

9. The method according to claim 6, wherein said total attenuation comprises attenuation of an antenna diversity switch.

10. A method, comprising the steps of:
measuring an apparent strength of a radio communication signal received by a radio circuit;
measuring a strength of noise received and generated by the radio circuit;
calculating a strength of the radio communication signal based at least in part upon the apparent strength of the radio communication signal and the strength of noise received and generated by the radio circuit;
repeating said step of measuring the strength of noise a predetermined number of times; and
selecting a minimum measured strength of noise for calculating the strength of the radio communication signal,
wherein said step of measuring the strength of noise comprises measuring a strength of noise at an ADC of the radio circuit and subtracting an amount of gain in the radio circuit prior to the ADC from the strength of noise received and generated by the radio circuit.

11. The method according to claim 10, wherein each step of measuring a strength of noise comprises averaging a set of noise samples taken during a sample window that occurs when the radio circuit is neither transmitting nor receiving.

12. A method, comprising the steps of:
measuring an apparent strength of a radio communication signal received by a radio circuit;
measuring a strength of noise received and generated by the radio circuit, wherein measuring the strength of noise generated by the radio circuit includes substantially electrically isolating the radio circuit from an antenna; and
calculating a strength of the radio communication signal based at least in part upon the apparent strength of the radio communication signal and the strength of noise received and generated by the radio circuit,
wherein the step of substantially electrically isolating the radio circuit comprises disconnecting the circuit from an antenna via a switch.

13. A method, comprising the steps of:
measuring an apparent strength of a radio communication signal received by a radio circuit at a first stage of a digital portion of a receive chain;
measuring a strength of noise received and generated by the radio circuit at a second stage of the digital portion of the receive chain; and
calculating a strength of the radio communication signal based at least in part upon the apparent strength of the radio communication signal and the strength of noise received and generated by the radio circuit,
wherein said step of measuring the strength of noise is performed during time periods with no transmission on a medium used by the radio circuit.

14. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit, wherein said step of measuring the strength of noise is performed during time periods with no transmission on a medium used by the radio circuit, wherein said time periods comprise windows that are shorter than an inter-packet gap.

15. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit,
wherein said step of measuring the strength of noise is performed during time periods with no transmission on a medium used by the radio circuit, wherein said time periods comprise SIFS periods.

16. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit,
wherein said step of measuring the strength of noise is performed during time periods with no transmission on a medium used by the radio circuit, wherein said time periods comprise DIFS+SLOT times in-between packets.

17. A method, comprising the steps of:
measuring an apparent strength of a radio communication signal received by a radio circuit;
measuring a strength of noise received and generated by the radio circuit;
calculating a strength of the radio communication signal based at least in part upon the apparent strength of the radio communication signal and the strength of noise received and generated by the radio circuit; and
storing measurements for use in subsequent noise calculations.

18. A method, comprising the steps of:
measuring an apparent strength of a radio communication signal received by a radio circuit;
measuring a strength of noise received and generated by the radio circuit;
calculating a strength of the radio communication signal based at least in part upon the apparent strength of the radio communication signal and the strength of noise received and generated by the radio circuit; and
repeating said steps of measuring a sufficient number of times over a period of time long enough to provide statistically accurate measurements.

19. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit,
wherein said step of measuring the strength of noise is performed during time periods with no transmission on a medium used by the radio circuit, wherein said method is repeated based on a predetermined criteria.

20. The method according to claim 19, wherein said predetermined criteria is temperature change of the radio circuit.

21. A method, comprising the steps of:
measuring an apparent strength of a radio communication signal received by a radio circuit;
measuring a strength of noise received and generated by the radio circuit;
calculating a strength of the radio communication signal based at least in part upon the apparent strength of the radio communication signal and the strength of noise received and generated by the radio circuit;
performing said steps of measuring the strength of noise and measuring the apparent strength at a set of different gain settings of the radio circuit; and
calculating the strength of the radio communication signal when at a given gain setting based on the noise strength as measured at the given gain setting.

22. A method, comprising the steps of:
measuring an apparent strength of a radio communication signal received by a radio circuit;
measuring a strength of noise received and generated by the radio circuit;
calculating a strength of the radio communication signal based at least in part upon the apparent strength of the radio communication signal and the strength of noise received and generated by the radio circuit;
performing said steps of measuring the strength of noise received by the radio circuit at a set of different gain settings of the radio circuit; and
populating a look-up table of each measured noise strength indexed by the gain setting at which it was measured.

23. The method according to claim 22, further comprising:
calculating a strength of the radio communication signal based at least in part upon the apparent strength of the radio communication signal and a measured noise strength in the look-up table for a gain setting of the radio circuit when the radio communication is received.

24. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit,
wherein said method is performed with an antenna switch attached to the radio circuit in a closed position.

25. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit,
wherein said method is performed with an antenna switch attached to the radio circuit in an open position.

26. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit, wherein said method is performed during normal operation of the radio circuit, and wherein said normal operation comprises 802.11 communications.

27. The method according to claim 26, wherein said 802.11 communications include any of 802.11a, 802.11b, 802.119, and an 802.11a high rate mode.

28. The method according to claim 27, wherein said 802.11a high rate mode comprises an 802.11a communication having a double rate of transmission and a double digital clock rate.

29. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit,
wherein said step of measuring the strength of noise received and generated by the radio circuit comprises measuring a predetermined number of samples at a predetermined frequency, wherein said predetermined frequency is dependent upon a protocol used by the radio circuit, and wherein said predetermined frequency is 40 MHz, 22 Mhz, 44 MHz, and 80 MHz respectively for each of 802.11a, 802.11b, 802.11g, and 802.11a high rate mode protocols.

30. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit,
wherein said step of measuring the strength of noise received and generated by the radio circuit comprises measuring a predetermined number of samples at a predetermined frequency, and wherein said predetermined number of samples is between 2 and 64 MB.

31. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit,
wherein said step of measuring the strength of noise received and generated by the radio circuit comprises measuring a predetermined number of samples at a predetermined frequency, and, wherein said predetermined number of samples is 256.

32. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit,
wherein said apparent strength of the radio communication (RSSI) is calculated during a search mode of a receiver receiving the radio communication.

33. The method according to claim 32, wherein said RSSI is calculated every 32 cycles in search mode.

34. A method, comprising the steps of:
measuring an apparent strength of a radio communication signal received by a radio circuit;
measuring a strength of noise received and generated by the radio circuit; and
calculating a strength of the radio communication signal based at least in part upon the apparent strength of the radio communication signal and the strength of noise received and generated by the radio circuit,
wherein said strength of the radio communication (RSSI) is calculated for a receiver during each of a search mode of the receiver, after gains of the receiver have settled, and before a final gain change for a communication signal having a packet incoming to the receiver.

35. The method according to claim 34, further comprising the step of holding a last RSSI value and not making any strength measurements for a duration of the incoming packet.

36. A method, comprising the steps of:
measuring an apparent strength of a radio communication signal received by the radio circuit;
measuring a strength of noise received and generated by a radio circuit;
calculating a strength of the radio communication signal based at least in part upon the apparent strength of the radio communication signal and the strength of noise received and generated by the radio circuit; and
continuing to calculate the strength of radio communication (RSSI) values for a duration of an incoming packet,
wherein said RSSI values are calculated every 32 cycles during receipt of the incoming packet.

37. A radio circuit, comprising:
a power detector configured to detect an amount of in-band power in the radio circuit;
a noise floor calculator configured to calculate a relative noise floor by subtracting a gain of the radio circuit from the detected in-band power detected by the power detector during a period when the radio circuit is neither transmitting nor receiving intended signals; and
an RSSI calculator configured to calculate an RSSI value for an incoming radio signal based on the power detected by the power detector during receipt of the incoming signal and the calculated relative noise floor.

38. The radio circuit according to claim 37, further comprising:
a look-up table configured to store relative noise floor calculations in relation to a gain setting at which the relative noise floor was calculated;
wherein said noise floor calculator is further configured to calculate the relative noise floor for each of multiple gain settings and store the calculated noise floors in the look-up table in relation to a gain setting at which each noise floor was calculated.

39. The radio circuit according to claim 37, further comprising:
a look-up table having a set of relative noise floor calculations stored in relation to a gain setting at which the relative noise floor was calculated;
wherein said RSSI calculator is further configured to retrieve a stored relative noise floor calculation from the look-up table for a gain setting of the radio circuit during receipt of the incoming signal and use the retrieved relative noise floor in the RSSI calculation.

40. The radio circuit according to claim 37, wherein:
said noise floor calculator is further configured to,
place transmit/receive switches in a receive path of the radio circuit in an open position that provides the receive path with a most available amount of isolation from signals, interference, and noise;
allow the radio circuit to settle into a high gain state;
measure in-band noise of a band on which an actual signal is to be received by the radio circuit via the power detector; and
reduce the measured in-band noise by an amount of a gain of a receive chain of the radio circuit to produce an antenna power.

41. The radio circuit according to claim 40, wherein said amount of a gain of a receive chain of the receiver comprises a variable gain of an Automatic Gain Control (AGC) amplifier of the receive chain.

42. The radio circuit according to claim 37, wherein said power detector measures the in-band power according to:
firpwrN=10×log10 (Sum k=0 to N−1 of (real (fir2output [k]))2+(imag(fir2output[k]))2);
where fir2output represents an output of a filter in a receive chain of the radio circuit.

43. The radio circuit according to claim 42, wherein N is a sufficient number of samples to provide a statistically accurate in-band power.

44. The radio circuit according to claim 42, wherein N is 256.

45. The radio circuit according to claim 37, wherein said noise floor calculator is further configured to perform a set of noise floor calculations and select a lowest noise floor calculation as the relative noise floor calculation.

46. The radio circuit according to claim 45, wherein each noise floor calculation comprises an average of noise floor samples taken during a window of time in which the radio circuit is neither transmitting nor receiving.

47. The radio circuit according to claim 46, wherein said window is shorter than an inter-packet gap in a protocol used to broadcast signals received by the receiver.

48. The radio circuit according to claim 47, wherein said inter-packet gap is an 802.11a Short Inter-Frame Spacing (SIFS).

49. The radio circuit according to claim 47, wherein said noise floor samples within each window are taken at a frequency sufficient to insure a statistically accurate noise measurement.

50. The radio circuit according to claim 37, wherein said inter-packet gap is 16 microseconds.

51. The radio circuit according to claim 37, wherein said noise floor calculator is configured to perform a statistical average of a predetermined number of noise samples at a predetermined frequency.

52. The radio circuit according to claim 51, wherein said predetermined frequency is dependent upon a protocol used by the radio circuit.

53. The radio circuit according to claim 52, wherein said predetermined frequency is 40 MHz, 22 MHz, 44 MHz, and 80 MHz respectively for each of 802.11a, 802.11b, 802.11g, and 802.11a high rate protocols.

54. The radio circuit according to claim 51, wherein said predetermined number of samples is between 2 and 64 MB.

55. The radio circuit according to claim 51, wherein said predetermined number of samples is 256.

* * * * *